United States Patent
Kim et al.

(10) Patent No.: US 9,070,845 B2
(45) Date of Patent: Jun. 30, 2015

(54) OPTICAL SEMICONDUCTOR LIGHTING APPARATUS

(71) Applicant: POSCO LED COMPANY LTD., Seongnam-si (KR)

(72) Inventors: Kyung-Rye Kim, Seongnam-si (KR); Ji Eun Kook, Seongnam-si (KR); Jung Hwa Kim, Seongnam-si (KR); Jing Jong Kim, Seongnam-si (KR); Min Uk Yoo, Seongnam-si (KR); Dae Won Kim, Seongnam-si (KR); Seong Bok Yoon, Seongnam-si (KR)

(73) Assignee: Posco LED Company Ltd., Seongnam-si (KR)

( * ) Notice: Subject to any disclaimer, the term of this patent is extended or adjusted under 35 U.S.C. 154(b) by 38 days.

(21) Appl. No.: 13/903,621

(22) Filed: May 28, 2013

(65) Prior Publication Data

US 2014/0306242 A1 Oct. 16, 2014

(30) Foreign Application Priority Data

Apr. 16, 2013 (KR) ........................ 10-2013-0041435

(51) Int. Cl.
*H01L 33/00* (2010.01)
*H01L 33/54* (2010.01)
*H01L 25/075* (2006.01)

(52) U.S. Cl.
CPC ............ *H01L 33/54* (2013.01); *H01L 25/0753* (2013.01); *H01L 2933/005* (2013.01)

(58) Field of Classification Search
CPC ....... H01L 33/50; H01L 33/502; H01L 33/54; H01L 25/0753; H01L 2933/005; H01L 2933/0041
See application file for complete search history.

(56) References Cited

U.S. PATENT DOCUMENTS

| | | | |
|---|---|---|---|
| 8,916,887 B2 * | 12/2014 | Kim | 257/88 |
| 8,941,293 B2 * | 1/2015 | Cheon et al. | 313/501 |
| 2003/0080341 A1 * | 5/2003 | Sakano et al. | 257/79 |
| 2006/0186431 A1 * | 8/2006 | Miki et al. | 257/100 |
| 2009/0134415 A1 * | 5/2009 | Morioka | 257/98 |
| 2012/0153335 A1 * | 6/2012 | Matsushita et al. | 257/98 |
| 2012/0193665 A1 * | 8/2012 | Yamada | 257/98 |
| 2013/0164869 A1 * | 6/2013 | Ebe et al. | 438/27 |
| 2014/0021502 A1 * | 1/2014 | Shimizu et al. | 257/98 |
| 2014/0168975 A1 * | 6/2014 | Ng et al. | 362/244 |
| 2014/0319560 A1 * | 10/2014 | Tischler | 257/98 |

* cited by examiner

*Primary Examiner* — Victor A Mandala
(74) *Attorney, Agent, or Firm* — H.C. Park & Associates, PLC

(57) ABSTRACT

An optical semiconductor lighting apparatus including: a substrate in which a single LED chip or a plurality of LED chips are disposed; a first mold portion disposed on the substrate to cover the plurality of LED chips; and a second mold portion extending from an edge of the first mold portion and disposed on the substrate. The respective LED chips can improve adhesive strength with respect to the substrate through the first and second mold portions. Peeling, surface cracking and damage caused by moisture permeation can be prevented by the first and second mold portions. A fluorescent material included in the second mold portion can improve a wavelength conversion rate.

9 Claims, 5 Drawing Sheets

1

OPTICAL SEMICONDUCTOR LIGHTING APPARATUS

CROSS-REFERENCE TO RELATED APPLICATION

This application claims priority from and the benefit of Korean Patent Application No. 10-2013-0041435, filed on Apr. 16, 2013, which is hereby incorporated by reference for all purposes as if fully set forth herein.

BACKGROUND OF THE INVENTION

1. Field

The present invention relates to an optical semiconductor lighting apparatus, and more particularly, to an optical semiconductor lighting apparatus that, when a plurality of LED chips are mounted, can prevent moisture permeation, reinforce a fixing force of the respective LED chips, and improve structural strength.

2. Discussion of the Background

Compared with incandescent lamps and fluorescent lamps, optical semiconductors using a light source, such as a light emitting diode (LED), an organic LED, a laser diode, and an organic electroluminescent diode, have low power consumption, long lifespan, and superior durability. Due to these advantages, the optical semiconductors have recently attracted attention as an illumination part.

In a lighting apparatus using such an optical semiconductor as a light source, an LED chip disposed on a substrate may be molded with a resin so as to protect the light source.

However, if the resin molded on the LED chip is used for a long time, a mold portion may be separated or peeled from the substrate due to complex factors such as generation of heat from the LED chip and moisture permeation into the LED chip through the mold portion.

In particular, malfunction of the LED chip and the like may occur when the surface of the mold portion is split or the resin is cracked and damaged while the resin molded on the LED chip is peeled from the substrate. For additional discussion, please see Korean Patent Application No. 10-2011-0083886 and Korean Patent Application No. 10-2011-0071144.

SUMMARY OF THE INVENTION

The present invention has been made in an effort to solve the above problems, and provides an optical semiconductor lighting apparatus that, when a plurality of LED chips are mounted, can prevent moisture permeation through a mold portion and can reinforce a fixing force of the respective LED chips.

In addition, the present invention is directed to provide an optical semiconductor lighting apparatus that can improve a structural strength from a structure such as a second mold portion and can increase a light wavelength conversion rate through a fluorescent material.

According to an aspect of the present invention, an optical semiconductor lighting apparatus includes: a substrate; a plurality of LED chips disposed in the substrate; a first mold portion disposed on the substrate to cover the plurality of LED chips; and a second mold portion extending from an edge of the first mold portion and connecting the first mold portion.

According to another aspect of the present invention, an optical semiconductor lighting apparatus includes: a substrate; an LED chip disposed in the substrate; a first mold portion disposed on the substrate to cover the LED chip; and a second mold portion extending from an edge of the first mold portion and disposed on the substrate.

A height from the top surface of the substrate to the top surface of the second mold portion may be lower than a height of the top surface of the LED chip.

A height from the top surface of the substrate to the top surface of the second mold portion may be equal to or lower than a height of the top surface of the LED chip.

The first mold portion may be made of a transparent or translucent resin material.

The first mold portion may include: a transparent or translucent resin; and a particle-shape fluorescent material mixed with the resin.

The first mold portion may include: a transparent or translucent resin; and a particle-shape fluorescent material mixed uniformly with the resin.

The first mold portion may include: a transparent or translucent resin; and a particle-shape fluorescent material mixed with the resin and disposed on surfaces of the LED chips and around the LED chips.

The second mold portion may include: a transparent or translucent resin mutually connecting the first mold portion and another first mold portion adjacent thereto; and a particle-shape fluorescent material mixed with the resin.

The first mold portion may include: a transparent or translucent resin; and a particle-shape fluorescent material disposed in a lower portion of the resin.

The first mold portion may include: a transparent or translucent resin; and a particle-shape fluorescent material mixed with the resin and disposed on the top surface of the first mold portion.

The first mold portion may include: a transparent or translucent resin; and a band of a fluorescent material with a predetermined thickness, which is mixed with the resin and connects the first mold portion to the second mold portion.

The first mold portion may include: a transparent or translucent resin; and a particle-shape fluorescent material disposed on an upper portion of the resin.

A shape of the first mold portion may be any one or a combination of one or more of a cylindrical shape, a semispherical shape, an oval semispherical shape, a polyprism shape, a conical shape, a truncated conical shape, a polypyramid shape, a truncated polypyramid shape, an overlapped shape of two semispheres, and an overlapped shape of two oval semispheres.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
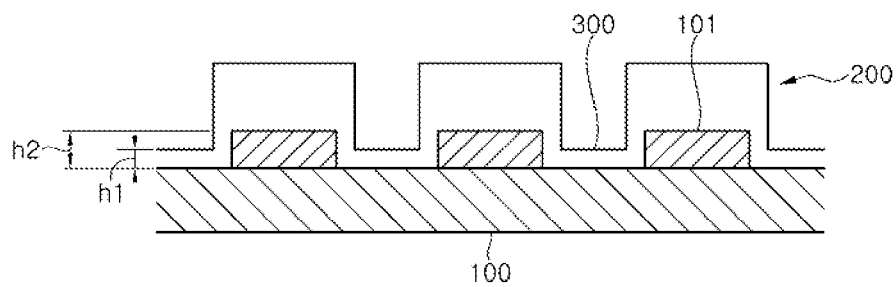
FIG. 1 is a cross-sectional conceptual diagram showing an overall configuration of an optical semiconductor lighting apparatus according to an exemplary embodiment of the present invention.

Exemplary embodiments of the present invention will be described below in detail with reference to the accompanying drawings. These embodiments are provided so that this disclosure will be thorough and complete, and will fully convey the scope of the invention to those skilled in the art. The invention may, however, be embodied in many different forms and should not be construed as being limited to the embodiments set forth herein. In the drawings, the widths, lengths and thicknesses of elements may be exaggerated for clarity. Throughout the drawings and description, like reference numerals will be used to refer to like elements.

FIG. 1 is a cross-sectional conceptual diagram showing an overall configuration of an optical semiconductor lighting apparatus according to an embodiment of the present invention.

As illustrated in FIG. 1, the optical semiconductor lighting apparatus according to the embodiment of the present invention is configured such that a first mold portion 200 and a second mold portion 300 are formed on a substrate 100.

A plurality of LED chips 101 used as a light source are disposed on the substrate 100. As illustrated in FIGS. 6 to 10, the substrate 100 may encompass a PCB and an MCPCB in which a single LED chip 101 is disposed.

The first mold portion 200 is disposed on the substrate 100 to cover the LED chips 101. The first mold portion 200 may perform a basic function of protecting the LED chips 101 from external impact, improve adhesive strength with respect to the substrate 100 together with the second mold portion 300 (described later), and improve a wavelength conversion rate of the LED chips 101.

The second mold portion 300 extends from an edge of the first mold portion 200 and is disposed on the substrate 100. The second mold portion 300 allows the first mold portion 200 to maintain the attached state with stronger force.

Generally, by adjusting the height of the first mold portion 200, the viewing angle and light distribution are easily adjusted. However, due to physical or chemical impact applied from the exterior, the first mold portion 200 may be separated from the substrate 100 and the LED chips 101.

The second mold portion 300 has been developed in the above-described viewpoint. The second mold portion 300 permits the first mold portion 200 and another first mold portion 200 adjacent thereto to maintain the arranged state with higher structural strength by providing a contact area such that the first mold portion 200 maintains the attached state on the substrate 100.

In addition to the above-described embodiment, the following various embodiments can also be applied to the present invention.

The LED chip 101 operates as the light source as described above. When a plurality of LED chips 101 are arranged, the LED chips 101 may be arranged on the substrate 100 in one or more rows and columns.

Array units in which a plurality of LED chips 101 are arranged in a row may be disposed radially from the center of the substrate 100.

The plurality of LED chips 101 may be arranged in a shape of multiple concentric circles from the center of the substrate 100.

In addition, according to the present invention, various applications and design modifications can also be made. For example, the plurality of LED chips 101 may be arranged in a shape of multiple polygons from the center of the substrate 100.

Meanwhile, when a height h1 from the top surface of the substrate 100 to the top surface of the second mold portion 300 is less than a height h2 of the top surface of the LED chip 101, it is possible to prevent optical interference and optical loss of light irradiated from the LED chip 101.

The first mold portion 200 may be made of transparent or translucent silicon or a resin material such as epoxy, so as to change the viewing angle and the light distribution area.

More specifically, the first mold portion 200 may include a transparent or translucent resin 210, and a particle-shape fluorescent material 220 mixed with the resin 210 so as to widen the viewing angle and increase the light distribution area.

Figure 2:
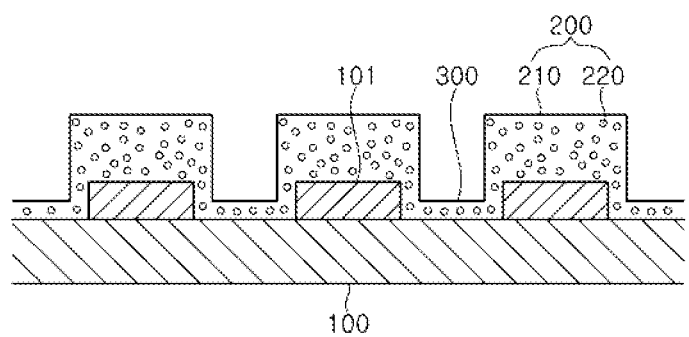
FIGS. 2, 3, 4, 5(*a*), 5(*b*), 5(*c*), 5(*d*), 5(*e*), 6, 7, 8, 9, and 10 are cross-sectional conceptual diagrams showing overall configurations of optical semiconductor lighting apparatuses according to various exemplary embodiments of the present invention.

That is, the particle-form fluorescent material 220 excites a wavelength of the LED chip 101 to a long wavelength, and may be uniformly mixed with the resin 210 as illustrated in FIG. 2.

In addition, as the fluorescent material 220 is more uniformly mixed with the resin 210, the ratio of excitation wavelength can be increased.

Figure 3:
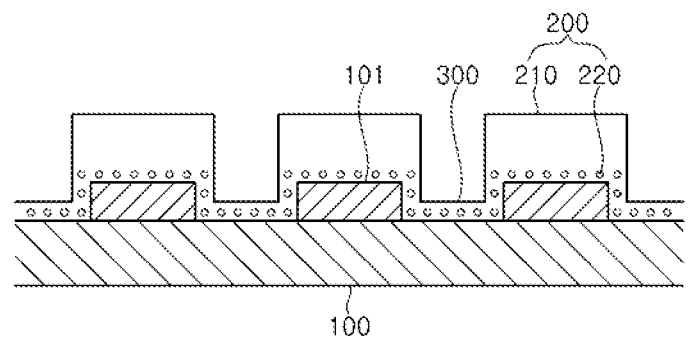

The fluorescent material 220 is mixed with a lower portion of the resin 210. More specifically, as illustrated in FIG. 3, the fluorescent material 220 may be disposed on the surfaces of the LED chips 101 and around the LED chips 101, and is not mixed with an upper portion of the first mold portion 200.

Figure 4:
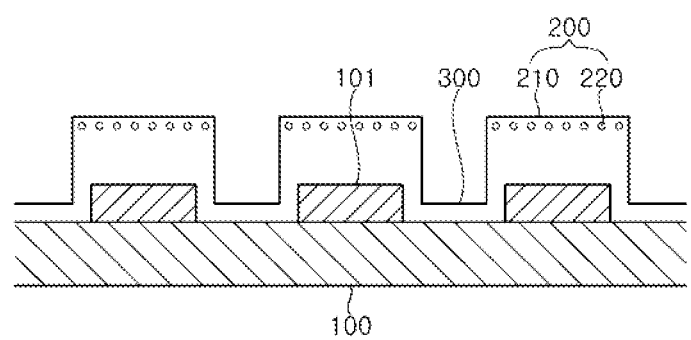
Figure 5:
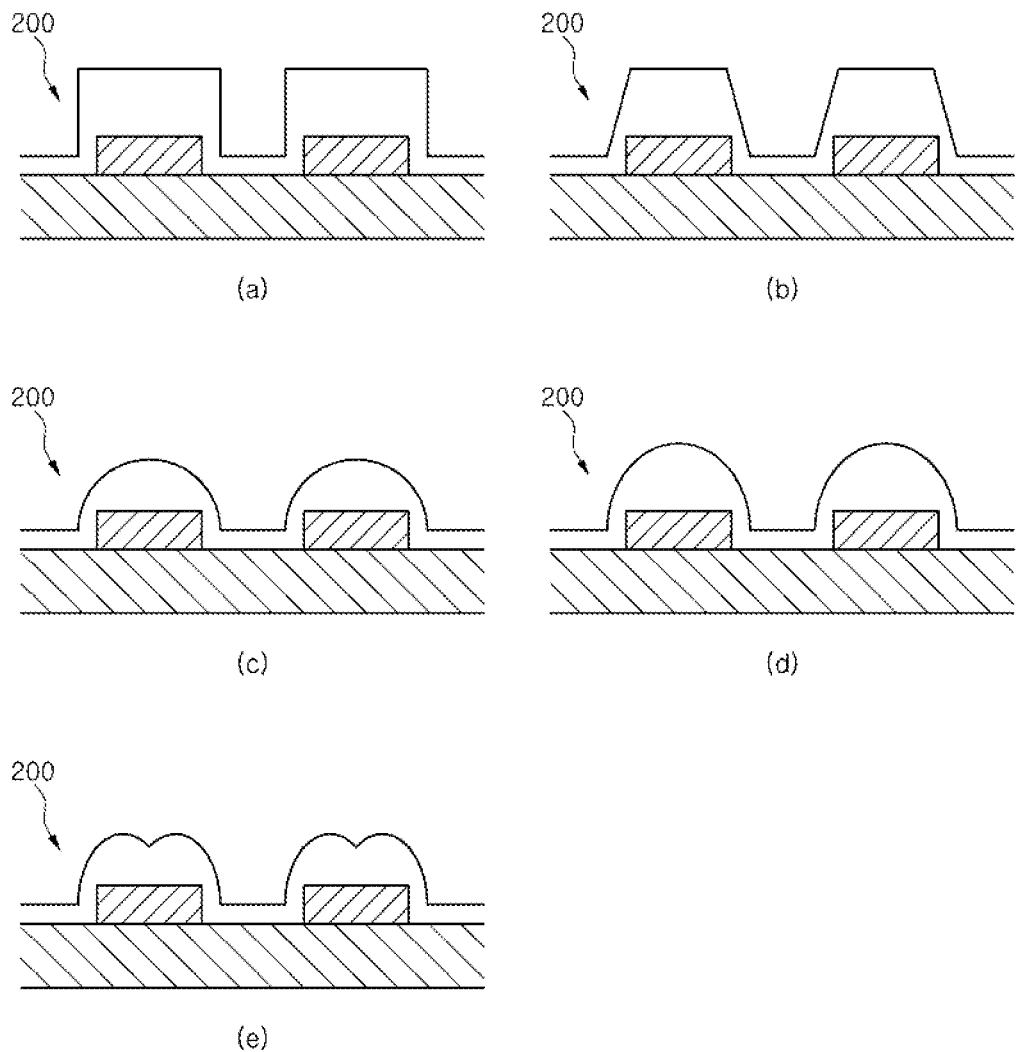
Figure 6:
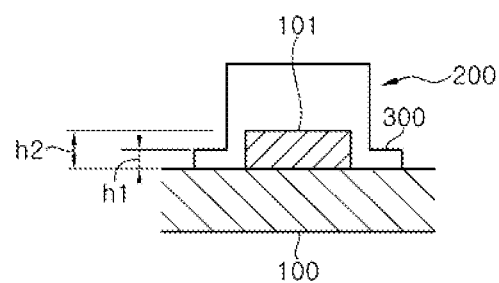

The fluorescent material 220 is mixed with an upper portion of the resin 210. More specifically, as illustrated in FIG. 4, the fluorescent material 220 may be disposed on the top surface of the first mold portion 200.

As described above, the selective arrangement of the fluorescent material 220 on the upper and lower portions of the resin 210 is changed according to viscosity of the resin 210 during melting upon transfer molding of the particle- or powder-form resin 210 and the fluorescent material 220, or the temperature or pressure condition for curing the first and second mold portions 200 and 300 to be formed later. This will be described below in detail.

In addition, the fluorescent material 220 is not limited to the particle-form material as described above, and nanoparticle sol and gel type materials may be coated on the surface of the resin 210.

In addition, the nanoparticle sol and gel type materials as the fluorescent material 220 may be coated on the surfaces of the LED chips 101 and around the LED chips 101, and the resin 210 may be disposed.

Meanwhile, as illustrated in FIGS. 5(a)-5(e), the first mold portion 200 may be formed in various shapes so as to increase the viewing angle and the light distribution area.

The first mold portion 200 may have a cylindrical shape or a polyprism shape like a cross-sectional shape illustrated in FIG. 5(a), or may have a truncated conical shape or a truncated polypyramid shape like a cross-sectional shape illustrated in FIG. 5(b).

The first mold portion 200 may have a semispherical shape such as a cross-sectional shape illustrated in FIG. 5(c), or may have an oval semispherical shape such as a cross-sectional shape illustrated in FIG. 5(d).

The first mold portion 200 may also have an overlapped shape of two semispheres or oval semispheres such as a cross-sectional shape illustrated in FIG. 5(e).

In addition, the first mold portion 200 may be designed with a combination of one or more of the cross-sectional shapes illustrated in FIGS. 5(a) to 5(e).

Meanwhile, as illustrated in FIGS. 6 to 10, the present invention can also be applied to an embodiment in which a first mold portion 200 is formed on a substrate 100 with a single LED chip 101 disposed therein, and a second mold portion 300 extends from an edge of the first mold portion 200 and is disposed on the substrate 100.

For reference, since essential parts of the optical semiconductor lighting apparatuses of FIGS. 6 to 10 according to various embodiments of the present invention are substantially similar to those of the embodiments of FIGS. 1 to 5(e), a detailed description thereof will be omitted.

The process of forming the first mold portion 200 and the second mold portion 300, which are essential parts of the optical semiconductor lighting apparatuses according to various embodiments, will be described below with reference to FIGS. 11 and 12.

Figure 7:
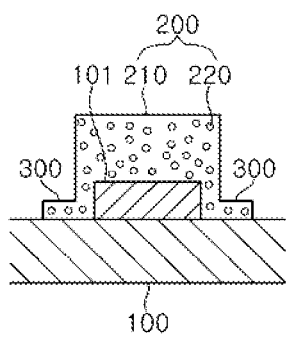

A mold 500, in which a cavity C is formed in a shape corresponding to the first mold portion 200 and the second mold portion 300, is used when intending to manufacture the first mold portion 200 and the second mold portion 300 in which the fluorescent material 220 is uniformly mixed with the resin 210 as illustrated in FIG. 2 (regarding the mold for manufacturing the embodiment of FIG. 7, see the description of the embodiment of FIG. 2).

That is, the fluorescent material 220 is uniformly mixed with a molten resin 210', and it is important to maintain the viscosity of the molten resin 210' at a predetermined level or higher so as to prevent the sinking of the particle-form fluorescent material 220.

Figure 11:
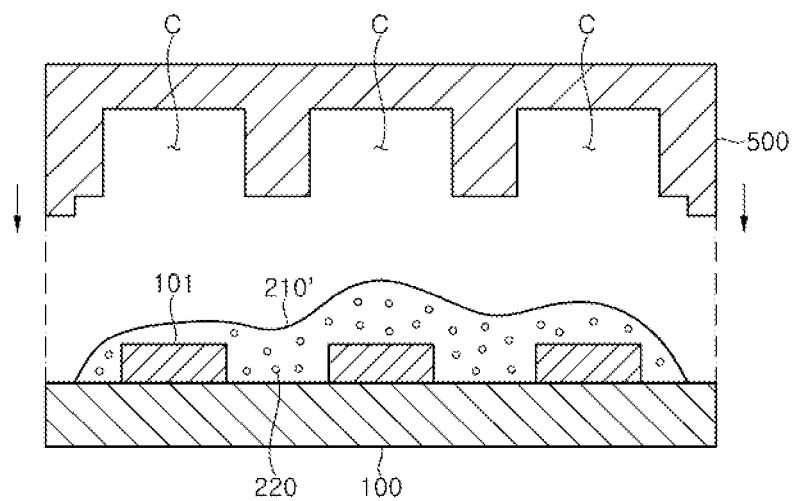
FIGS. 11 and 12 are cross-sectional conceptual diagrams showing methods for manufacturing optical semiconductor lighting apparatuses according to various exemplary embodiments of the present invention.

Therefore, as illustrated in FIG. 11, an operator may form the first mold portion 200 and the second mold portion 300 by injecting the molten resin 210' uniformly mixed with the fluorescent material 220 onto the substrate 100 and the LED chips 101 and then descending the cavity C before the molten resin 210' is coagulated.

Figure 8:
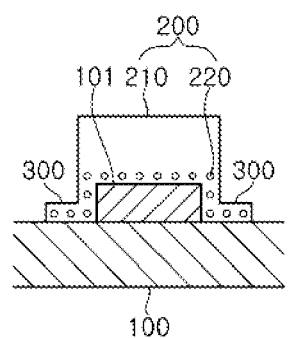
Figure 12:
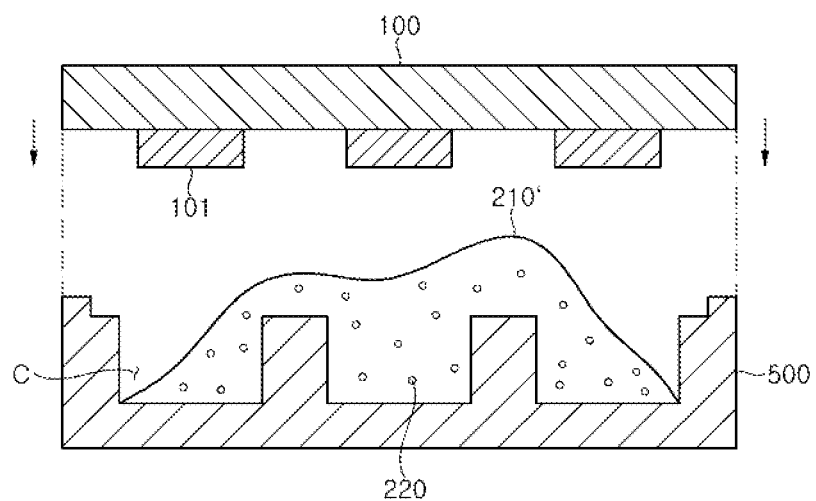

In addition, as illustrated in FIG. 12, an operator may form the first mold portion 200 and the second mold portion 300 by injecting the molten resin 210' uniformly mixed with the fluorescent material 220 into the cavity C of the mold 500 opened upward and then descending the substrate 100, in which the LED chips 101 are directed downward, before the molten resin 210' is coagulated Meanwhile, the mold 500 as illustrated in FIG. 11 is used when intending to manufacture the first mold portion 200 and the second mold portion 300 in which the fluorescent material 220 is disposed on the surfaces of the LED chips 101 and around the LED chips 101 as illustrated in FIG. 3 (regarding the mold for manufacturing the embodiment of FIG. 8, see the description of the embodiment of FIG. 3).

That is, the molten resin 210' is mixed with the fluorescent material 220, and the curing degree of the molten resin 210' may be adjusted such that the particle-form fluorescent material 220 is sunk.

Therefore, as illustrated in FIG. 11, an operator may form the first mold portion 200 and the second mold portion 300 by injecting the molten resin 210' mixed with the fluorescent material 220 onto the substrate 100 and the LED chips 101 and then descending the mold 500, in which the cavity C is directed downward, after waiting for a predetermined time before the fluorescent material 220 is sunk.

Figure 9:
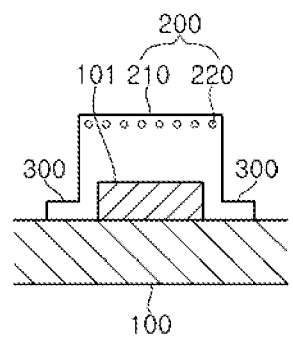
Figure 10:
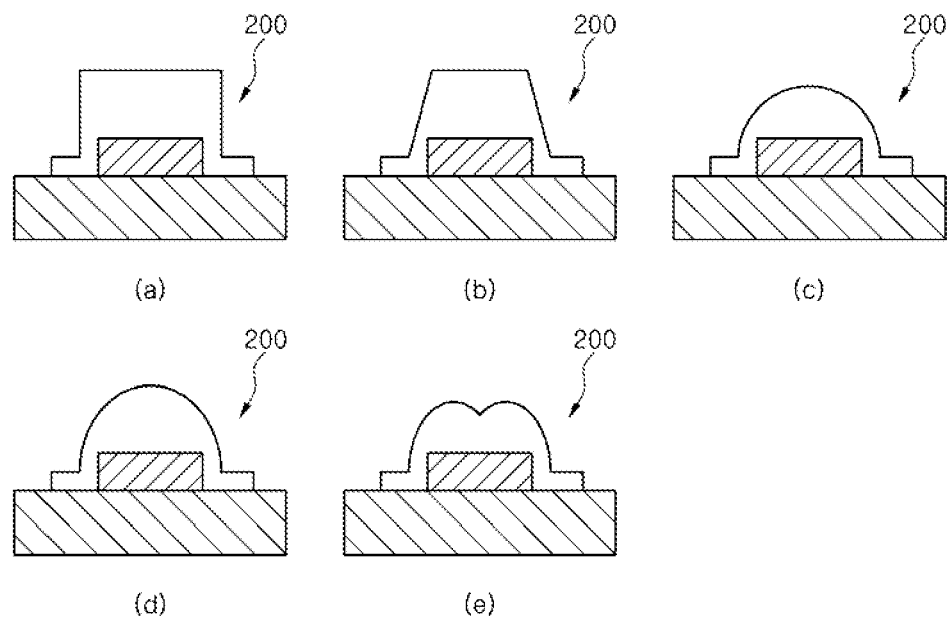

Meanwhile, the mold 500 as illustrated in FIG. 12 is used when intending to manufacture the first mold portion 200 and the second mold portion 300 in which the fluorescent material 220 is disposed around the top surface of the resin 210 as illustrated in FIG. 4 (regarding the mold for manufacturing the embodiment of FIG. 9, see the description of the embodiment of FIG. 4).

That is, the molten resin 210' is mixed with the fluorescent material 220, and the curing degree of the molten resin 210' may be adjusted such that the particle-form fluorescent material 220 is sunk.

Therefore, as illustrated in FIG. 12, an operator may form the first mold portion 200 and the second mold portion 300 by injecting the molten resin 210' mixed with the fluorescent material 220 into the cavity C of the mold 500 and then descending the substrate 100, in which the LED chips 101 are directed downward, after waiting for a predetermined time before the fluorescent material 220 is sunk.

As described above, it can be seen that the basic technical spirit of the present invention is to provide the optical semiconductor lighting apparatus that, when a plurality of LED chips are mounted, can prevent moisture permeation and reinforce the fixing force of the respective LED chips, can improve the structural strength from the structure such as the second molding portion, and can increase the light conversion rate.

The above-described configurations according to the present invention can obtain the following effects.

First, according to the present invention, the first mold portion made of the resin material covers the LED chips, and the second mold portion extends from the edge of the first mold portion and covers the top surface of the substrate. Therefore, the second mold portion further reinforces the fixing force of the first mold portion on the substrate, preventing the first mold portion from being peeled off by factors such as temperature and humidity.

In particular, in a case where a plurality of LED chips is disposed on the substrate, the second mold portion can exhibit a more powerful function as the fixing area increases.

In particular, according to the present invention, the fluorescent material is disposed in the second mold portion as well as the first mold portion, further expanding the light distribution area and improving the wavelength conversion rate.

That is, when the fluorescent material is disposed in the first and second mold portions, a wavelength of light directed from the LED chip toward the substrate can be converted into a long wavelength.

Due to the structure of the second mold portion mutually connecting the first mold portions, the first mold portion can maintain the structural strength from external impact, without separation from the LED chips and the substrate.

Moreover, the optical semiconductor lighting apparatus according to the present invention is easy to manufacture because the first mold portion and the second mold portion are integrally formed by the resin material.

While the embodiments of the present invention have been described with reference to the specific embodiments, it will be apparent to those skilled in the art that various changes and modifications may be made without departing from the spirit and scope of the invention as defined in the following claims.

What is claimed is:

1. An optical semiconductor lighting apparatus, comprising:
  a substrate;
  a plurality of LED chips disposed in the substrate;
  a first mold portion disposed on the substrate to cover the plurality of LED chips; and
  a second mold portion extending from an edge of the first mold portion and connecting the first mold portion,
  wherein the first mold portion comprises:
    a transparent or translucent resin; and
    a particle-shape fluorescent material mixed with the resin; and the particle-shape fluorescent material is disposed only on surfaces of the LED chips and around the LED chips, and is not mixed with an upper portion of the first mold portion.

2. The optical semiconductor lighting apparatus of claim 1, wherein a height from the top surface of the substrate to the top surface of the second mold portion is less than a height of the top surface of the LED chip.

3. The optical semiconductor lighting apparatus of claim 1, wherein a height from the top surface of the substrate to the top surface of the second mold portion is equal to or less than a height of the top surface of the LED chip.

4. The optical semiconductor lighting apparatus of claim 1, wherein the second mold portion comprises:
   the transparent or translucent resin mutually connecting the first mold portion and another first mold portion adjacent thereto; and
   the particle-shape fluorescent material mixed with the resin.

5. The optical semiconductor lighting apparatus of claim 1, wherein the first mold portion comprises:
   the transparent or translucent resin; and
   a band of the particle-shape fluorescent material, which is mixed with the resin and connects the first mold portion to the second mold portion.

6. The optical semiconductor lighting apparatus of claim 1, wherein a shape of the first mold portion is any one or a combination of one or more of a cylindrical shape, a semispherical shape, an oval semispherical shape, a polyprism shape, a conical shape, a truncated conical shape, a polypyramid shape, a truncated polypyramid shape, an overlapped shape of two semispheres, and an overlapped shape of two oval semispheres.

7. An optical semiconductor lighting apparatus, comprising:
   a substrate;
   an LED chip disposed in the substrate;
   a first mold portion disposed on the substrate to cover the LED chip; and
   a second mold portion extending from an edge of the first mold portion and disposed on the substrate,
   wherein the first mold portion comprises:
      a transparent or translucent resin; and
      a particle-shape fluorescent material mixed with the resin; and
      the particle-shape fluorescent material is disposed only on surfaces of the LED chips and around the LED chips, and is not mixed with an upper portion of the first mold portion.

8. The optical semiconductor lighting apparatus of claim 7, wherein a height from the top surface of the substrate to the top surface of the second mold portion is less than a height of the top surface of the LED chip.

9. The optical semiconductor lighting apparatus of claim 7, wherein a shape of the first mold portion is any one or a combination of one or more of a cylindrical shape, a semispherical shape, an oval semispherical shape, a polyprism shape, a conical shape, a truncated conical shape, a polypyramid shape, a truncated polypyramid shape, an overlapped shape of two semispheres, and an overlapped shape of two oval semispheres.

* * * * *